(12) United States Patent
Wang et al.

(10) Patent No.: US 8,852,996 B2
(45) Date of Patent: Oct. 7, 2014

(54) CARBON DOPED RESISTIVE SWITCHING LAYERS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

(*) Notice: Subject to any disclaimer, the term of this patent is extended or adjusted under 35 U.S.C. 154(b) by 92 days.

(21) Appl. No.: 13/721,587

(22) Filed: Dec. 20, 2012

(65) Prior Publication Data

US 2014/0175355 A1  Jun. 26, 2014

(51) Int. Cl.
*H01L 29/02* (2006.01)
*H01L 45/00* (2006.01)

(52) U.S. Cl.
CPC .................... *H01L 45/1633* (2013.01)
USPC ............... 438/102; 438/103; 438/104; 257/2; 257/3; 257/4; 257/5; 257/E29.02

(58) Field of Classification Search
CPC ......... H01L 45/04; H01L 29/00; H01L 27/24; G11C 13/0004
USPC ................... 438/102–104; 257/2–5, E29.002
See application file for complete search history.

(56) References Cited

U.S. PATENT DOCUMENTS

| | | | |
|---|---|---|---|
| 7,084,078 B2 | 8/2006 | Ahn et al. | |
| 7,220,982 B2 | 5/2007 | Campbell | |
| 7,344,946 B2 | 3/2008 | Moore et al. | |
| 8,110,476 B2 | 2/2012 | Scheuerlein et al. | |
| 2008/0213940 A1* | 9/2008 | Lee et al. | 438/104 |
| 2009/0256130 A1 | 10/2009 | Schricker | |
| 2009/0256131 A1 | 10/2009 | Schricker | |
| 2010/0102417 A1* | 4/2010 | Ganguli et al. | 257/532 |
| 2011/0175052 A1 | 7/2011 | Hwang | |

OTHER PUBLICATIONS

Toriumi et al; Doped HfO2 for Higherk Dielectrics; Jan. 1, 2005; University of Tokyo; 208th ECS Meeting Abstract #508.

Xiang, W., et al.; Heteroepitaxial Growth of NbDoped SrTiO3 Films on Si Substrates by Pulsed Deposition for Resistance Memory Applications; Jan. 1, 2007; Academia—Gwangju Institute of Science and Technology (Gwangju, KR); Applied Physics Letters vol. 90 pp. 0521101 to 0521103.

Schmidt, B., et al.; Carbon Incorporation in Chemical Vapor Deposited Aluminum Oxide Films; Jan. 1, 2010; Book—Elsevier; Thin Solid Films pp. 36583663.

* cited by examiner

*Primary Examiner* — Jami M Valentine

(57) ABSTRACT

Provided are carbon doped resistive switching layers, resistive random access memory (ReRAM) cells including these layers, as well as methods of forming thereof. Carbon doping of metal containing materials creates defects in these materials that allow forming and breaking conductive paths as evidenced by resistive switching. Relative to many conventional dopants, carbon has a lower diffusivity in many suitable base materials. As such, these carbon doped materials exhibit structural stability and consistent resistive switching over many operating cycles. Resistive switching layers may include as much as 30 atomic percent of carbon, making the dopant control relatively simple and flexible. Furthermore, carbon doping has acceptor characteristics resulting in a high resistivity and low switching currents, which are very desirable for ReRAM applications. Carbon doped metal containing layer may be formed from metalorganic precursors at temperatures below saturation ranges of atomic layer deposition.

18 Claims, 6 Drawing Sheets

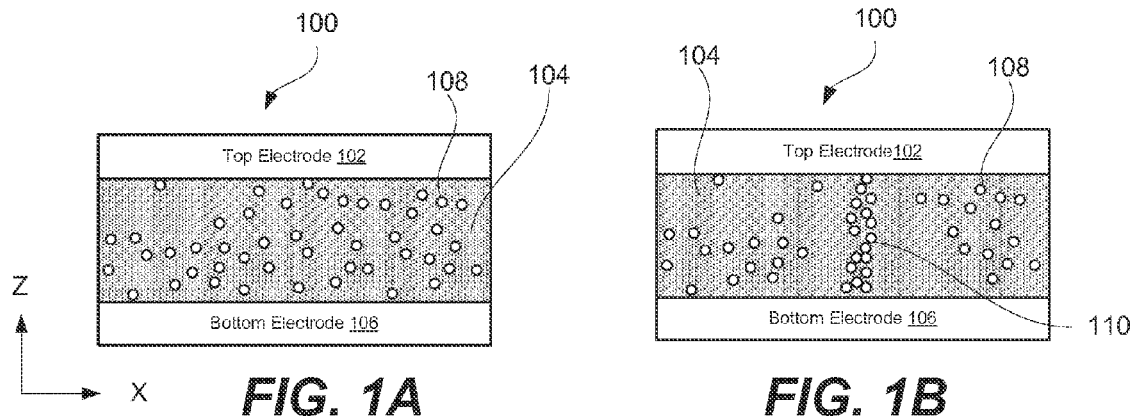
FIG. 1A     FIG. 1B
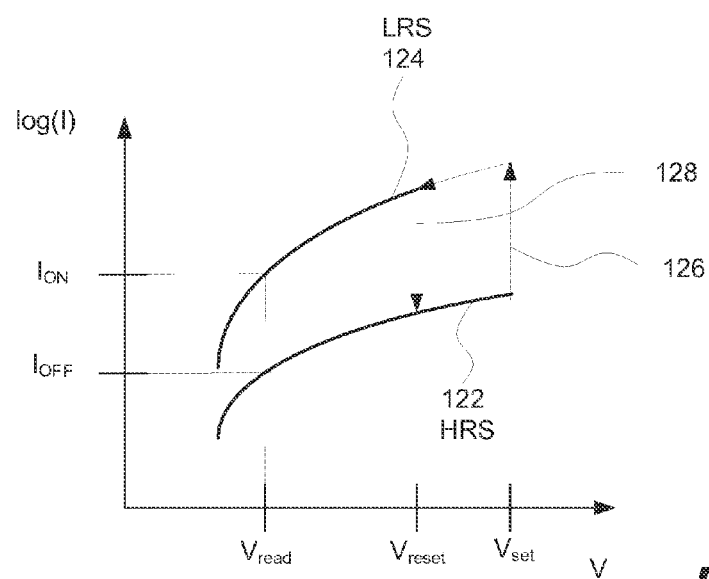
FIG. 2

CARBON DOPED RESISTIVE SWITCHING LAYERS

TECHNICAL FIELD

The present invention relates generally to semiconductor devices and processes and, more specifically, to carbon doped resistive switching layers and resistive random access memory (ReRAM) cells containing these layers.

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., USB flash drives). Nonvolatile memory is becoming more popular because of its small size and high density, low power consumption, fast read and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory (ReRAM), are being developed to meet these demands and requirements.

SUMMARY

Provided are carbon doped resistive switching layers, resistive random access memory (ReRAM) cells including these layers, as well as methods of forming thereof. Carbon doping of metal containing materials creates defects in these materials that allow forming and breaking conductive paths as evidenced by resistive switching. Relative to many conventional dopants, carbon has a lower diffusivity in many suitable base materials. As such, these carbon doped materials exhibit structural stability and consistent resistive switching over many operating cycles. Resistive switching layers may include as much as 30 atomic percent of carbon, e.g., between about 10 atomic percent and 20 atomic percent, making the dopant control relatively simple and flexible. Furthermore, carbon doping has acceptor characteristics resulting in a high resistivity and low switching currents, which are very desirable for ReRAM applications. Carbon doped metal containing layer may be formed from metalorganic precursors at temperatures below saturation ranges of atomic layer deposition. Doping is achieved by retaining some cleaved C—H bonds provided in the precursor. This operating regime may be referred to as a not fully reacted ALD process. The temperature still needs to be sufficient for some reactions to proceed.

In some embodiments, a method of forming a resistive random access memory cell involves providing a substrate into a processing chamber and flowing a metalorganic precursor into the processing chamber such that a portion of the metalorganic precursor is adsorbed on the substrate. The process then continues with flowing an oxidizing agent into the processing chamber such that a portion of the oxidizing agent reacts with the adsorbed metalorganic precursor forming a layer of a metal containing material. The substrate is maintained at a temperature lower than a saturation range temperature associated with the metalorganic precursor resulting in partial decomposition of the adsorbed metalorganic precursor and in carbon doping of the metal containing material. The resulting layer of the carbon doped metal containing material is operable as a resistive switching layer in the resistive random access memory cell.

In some embodiments, the method involves performing a treatment of the carbon doped metal containing material. The treatment may involve plasma treatment or thermal treatment. The treated material may have fewer carbon-hydrogen bonds than the untreated material. In some embodiments, the treated material has more carbon-carbon and carbon-oxygen bonds than the untreated material. A concentration of carbon in the treated material and the untreated material may be substantially the same. The treatment may involve plasma nitridation. Such treatment incorporates nitrogen into the carbon doped metal containing material. The plasma nitridation is performed for at least 60 seconds and less than 180 seconds. In some embodiments, the treatment involves plasma carbonization or thermal carbonization.

In some embodiments, the metalorganic precursor includes tetrakis dimethylamido hafnium (TDMAHf). In these embodiments, the substrate may be maintained at a temperature of between 300° C. and 340° C. while forming the carbon doped metal containing layer. In some embodiments, the metalorganic precursor includes trimethal aluminum (TMA). The substrate may be maintained at a temperature of 230° C. and 270° C. while forming the carbon doped metal containing layer.

In some embodiments, the carbon doped metal containing material is either hafnium oxide, aluminum oxide, nickel oxide, or zirconium oxide. Various combinations of these oxides may be used as well. In some embodiments, a set current of the resistive random access memory cell is less than about 50 microamperes, while a reset current is less than 200 microamperes. The thickness of the layer of the carbon doped metal containing material may be less than about 100 Angstroms. The thickness of the layer of the carbon doped metal containing material may be less than about 50 Angstroms. The first electrode layer provided on the substrate may be formed from doped polysilicon. The layer of the carbon doped metal containing material may directly interface the first electrode layer. In some embodiments, the method also involves forming a second electrode layer over the layer of the carbon doped metal containing material. The second electrode layer may include titanium nitride.

Provided also is a resistive random access memory that includes a first electrode layer, a second electrode layer, and a resistive switching layer containing a carbon doped metal oxide. The resistive switching layer is disposed between the first electrode layer and the second electrode layer and has a thickness of less than 50 Angstroms. The carbon doped metal oxide includes one or more of hafnium oxide, aluminum oxide, nickel oxide, or zirconium oxide. The concentration of carbon in the carbon doped metal oxide may be between about 10 atomic percent and 20 atomic percent. In some embodiments, a set current of the resistive random access memory is less than 50 microamperes, while a reset current of the resistive random access memory is less than 200 microamperes.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIGS. 1A and 1B illustrate schematic representations of a ReRAM cell in its high resistive state (HRS) and low resistive state (LRS), in accordance with some embodiments.

FIG. 2 illustrates a plot of a current passing through a ReRAM cell as a function of a voltage applied to the ReRAM cell, in accordance with some embodiments.

DETAILED DESCRIPTION

Figure 3A:
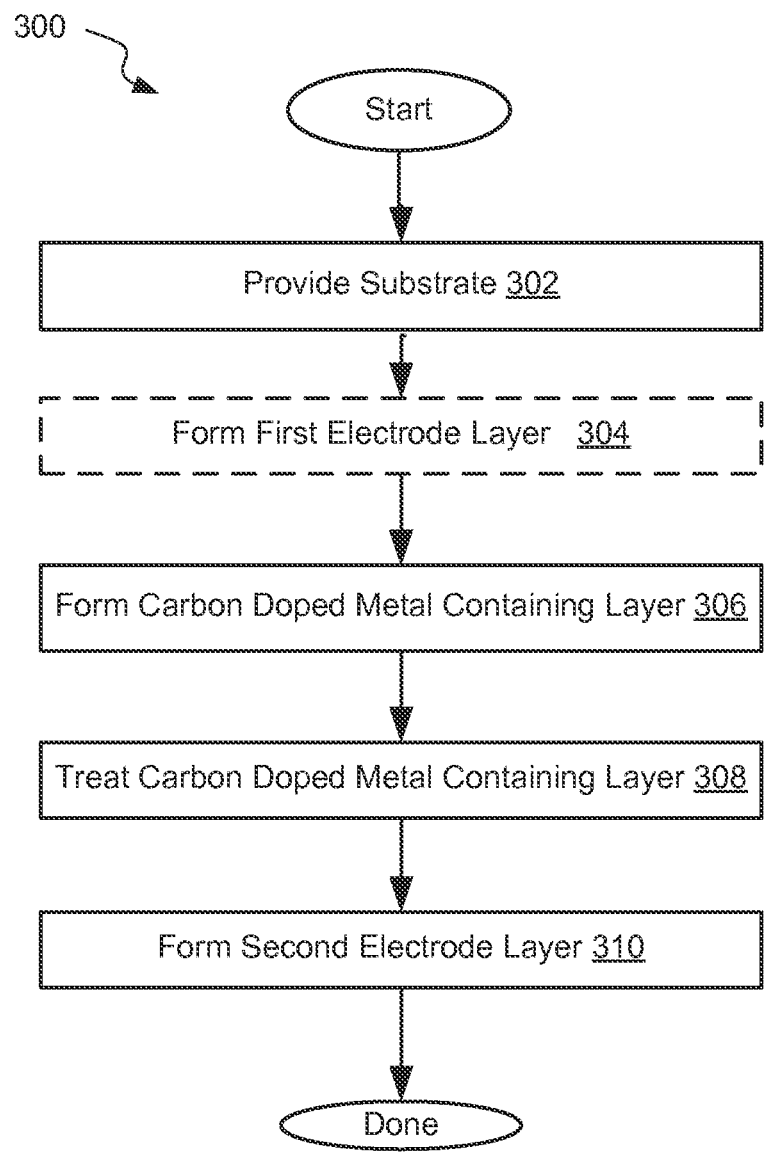
FIG. 3A illustrates a process flowchart corresponding to a method of forming a ReRAM cell using atomic layer deposition, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers are identified as "M" and may include metals and/or other conductive materials. The stack also includes an insulator layer provided in between the electrode. This layer is indentified as "I" in the above naming convention. The insulator layer exhibits resistive switching properties characterized by different resistive states of the material forming this layer. As such, this insulator layer is often referred to as a resistive switching layer. These resistive states may be used to represent one or more bits of information.

The resistive switching layer changes its resistive state in response to applying a certain voltage (e.g., a set voltage or a reset voltage) to this layer as further discussed below. The applied voltage causes some localized heating within the layer and/or at its interfaces with other components, such as the electrode layers. Without being restricted to any particular theory, it is believed that a combination of the electrical field and localized heating (both created by the applied voltage) causes formation and breakage of various conductive paths within the resistive switching layer and/or at its interfaces.

Formation of conductive paths may be assisted by introducing defects into the resistive switching layer during its fabrication. The defects may be introduced by doping a base material, such as oxides and/or nitrides of transition metals. Dopant atoms replace base material atoms in the original base material structure (e.g., its lattice) causing stresses within this structure. These stresses make it easier to form conductive paths through the doped structure than, for example, to form similar paths through an undoped structure. Doped materials should be distinguished from mixtures and alloys of multiple materials. Dopants have a substitutional nature, in which dopant atoms substitute base material atoms thereby stressing the original base material structure without substantially modifying it. Alloys and mixtures may be partial or complete solid solutions of multiple elements or compounds. A complete solid solution alloys has a new solid phase micro structure, while a partial solution may have two or more phases that may be homogeneous in distribution depending on the heat treatment used. Other distinctions between doped materials and alloyed materials appear in their electrical properties. Doping introduces a sub-band between the conduction band and valence band. The energy different between the sub-band and the conduction band or between the sub-band and the valence band is called activation energy. Doping may require some activation, which provides the energy between the sub-band and the conduction band. This activation may be provided by thermal anneal or radiation. To the contrary, alloys do not require such activation. The alloys are considered to be intrinsic materials, e.g., forming various morphologies (e.g., crystalline structures) with no impurity atoms or defects. Doped materials are called extrinsic materials, and their electrical properties can be altered in desirable ways by adding controlled amount of specific impurity atoms to the base material.

While generally all dopants form defects in base materials, only some dopants are suitable for resistive switching applications. For example, resistive switching layers need to be able to form and break conductive paths repeatedly and reproducibly over many cycles. Such resistive switching should be triggered by minimal voltages and currents applied to ReRAM cells. The resistive switching layers should be easy to fabricate and generally should have minimal dimension for advanced node applications.

It has been found that carbon is a suitable dopant for many materials used as resistive switching layers, such as hafnium oxide, aluminum oxide, zirconium oxide, and others listed below. Relative to some other dopants, carbon has lower diffusivity in many of these base materials. The low diffusivity helps maintain structural stability and repeatable performance over many operational cycles. Carbon can be incorporated as a dopant at relatively high concentrations, such as up to 30 atomic percent or, more specifically, between about 10 atomic percent and 20 atomic percent. Higher carbon content, in comparison to conventional doping levels used for other applications, allows more flexibility in doping control and simplifies fabrication. For example, carbon can be incorporated by partial decomposition of metalorganic precursors.

Furthermore, carbon doping has acceptor characteristics resulting in a high resistivity and low switching currents. These properties are desirable for resistive switching layers and allow designers to reduce power consumption and to improve stability of ReRAM cells.

Carbon can be incorporated into resistive switching layers by controlling process conditions and selecting metalorganic precursors. In some embodiments, forming carbon doped layers may be performed at temperatures below saturation ranges of atomic layer deposition (ALD). This temperature selection causes a portion of the metalorganic precursor to decompose. The remaining portion of the adsorbed precursor is reacted with an oxidizing agent to form a base metal containing material, which traps some carbon from the decomposition products. Conventional ALD and CVD processes generally try to avoid these phenomena and strive for contaminant-free layers, e.g., high purity metal oxides or nitrides. As such, their temperature selections and composition criteria are different. In some embodiments, forming a carbon doped layer is performed at a temperature below a saturation temperature range associated with a metalorganic precursor used in this operation. Yet, this temperature selection still allows some adsorption of the metalorganic precursor on the surface and oxidizing of this metalorganic precursor to form the base material.

Deposited carbon doped materials can be further processed to modify their structures and, in some embodiments, their compositions. For example, a carbon doped metal containing layer may be thermally and/or plasma treated, e.g., subjected to plasma nitridation and/or plasma carbonization. In some embodiments, this treatment changes chemical bonds in the original deposited material. For example, a treated carbon doped material may have fewer carbon-hydrogen bonds than the untreated one. In some embodiments, the treated material may have more carbon-carbon and carbon-oxygen bonds than the untreated one. These types of changes may be observed using various analytical techniques, such as X-ray photoelectron spectroscopy (XPS) as further described in the experimental section below. It should be noted that these treatments may or may not change the composition of the treated layers. In some embodiments, chemical bond changes may occur without changing the composition of the treated layers.

Examples of Nonvolatile ReRAM Cells and their Switching Mechanisms

A brief description of ReRAM cells is provided for context and better understanding of various features associated with sequential deposition of electrodes and resistive switching layers. A ReRAM cell includes a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

A basic building unit of a memory device is a stack having a capacitor like structure. A ReRAM cell includes two electrodes and a dielectric material positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Resistance switching layer 104 which may be initially formed from a dielectric material and later can be made to conduct through one or more filaments or conduction paths formed by applying a set voltage. To provide this resistive switching functionality, resistance switching layer 104 includes a concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Without being restricted to any particular theory, it is believed that defects 108 can be reoriented within resistance switching layer 104 to form filaments or conduction paths as, for example, schematically shown in FIG. 1B as element 110. This reorientation of defects 108 occurs when a voltage for this type of resistance switching layer 104 is applied to electrodes 102 and 106. Sometimes, reorientation of defects 108 is referred to as filling the traps by applying a set voltage (and forming one or more filaments or conduction paths) and emptying the traps by applying a reset voltage (and breaking the previously formed filaments or conduction paths).

Defects 108 can be introduced into resistance switching layer 104 during or after its fabrication. For example, a concentration of oxygen deficiencies can be introduced into metal oxides during their deposition or during subsequent annealing.

Operation of ReRAM cell 100 will now be briefly described with reference to FIG. 2 illustrating a logarithmic plot of a current passing through a ReRAM cell as a function of a voltage applied to the electrode of ReRAM cell, in accordance with some embodiments. ReRAM cell 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each ReRAM cell that has two resistance states may be used to store one bit of data. It should be noted that some ReRAM cells may have three and even more resistance states allowing multi-bit storage in the same cell.

HRS and LRS are defined by presence or absence of one or more filaments or conduction paths in resistance switching layer 104 and forming connections between these filaments or conduction paths and two electrodes 102 and 106. For example, a ReRAM cell may be initially fabricated in LRS and then switched to HRS. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). During the read operation, the state of ReRAM cell 100 or, more specifically, the resistance of resistance switching layer 104 can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistance switching layer 104 and switches ReRAM cell 100 from its HRS to LRS as indicated by dashed line 126. It should be noted that formation or breaking of filaments or conduction paths in resistance switching layer 104 may also involve forming or breaking electrical connections between these filaments and one (e.g., reactive electrode) or both electrodes. The overarching concern is passage of the current between the two electrodes.

In LRS, the resistance characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to ReRAM cell 100 to break the previously formed filaments or conduction paths in resistance switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistance switching layer 104. In the bipolar switching the set voltage ($V_{SET}$) and reset voltage ($V_{RESET}$) applied to resistance switching layer 104 need to have different polarities.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., a high $I_{SET}/I_{RESET}$ ratio) that correspond to set voltage ($V_{SET}$) and reset voltage ($V_{RESET}$) may be at least about 5 or, more specifically, at least about 10 to make the state of ReRAM cell easier to determine. ReRAM cells should be able to cycle between LRS and HRS between at least about $10^3$ times or, more specifically, at least about $10^7$ times without failure. A data retention time (tRET) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistance switching layers interconnected in series. Adjacent resistance switching layers may directly interface each other or be separated by an intermediate layer.

In some embodiments, a ReRAM cell is subjected to a forming operation, during which the initially insulating properties of the resistance switching layer are altered and the ReRAM cell is configured into the initial LRS or HRS. The forming operation may include a very short high discharge current peak associated with a forming voltage, which is used to set the LRS level of the resistance switching layer for subsequent switching as outlined above. In this case, a resistance switching layer with very low levels (e.g., 100-30 kOhm) of resistance in the LRS may be limited in terms of scaling down. This difficulty may be resolved by positioning such resistance switching layers in series with other components providing additional resistance to the overall ReRAM cell.

Processing Examples

FIG. 3A illustrates a process flowchart corresponding to method 300 of forming a ReRAM cell, in accordance with some embodiments. Method 300 may commence with providing a substrate during operation 302. In some embodiments, the provided substrate includes a first electrode layer, in which case method 300 proceeds with forming a carbon doped metal containing layer during operation 306. Alternatively, method 300 may proceed with forming a first electrode on the provided substrate layer during operation 304. The first electrode layer may be formed from one or more of the following materials: silicon (e.g., n-doped poly-silicon or p-doped poly-silicon), silicides, silicide-germanides, germanides, titanium, titanium nitride (TiN), platinum, iridium, iridium oxide, ruthenium, ruthenium oxide, and the like. Generally, any sufficiently conductive material may be used to form an electrode. In some embodiments, barrier layers, adhesion layers, antireflection coatings and/or the like may be used with the electrodes and to improve device performance and/or aid in device fabrication.

In some embodiments, one electrode may be a higher work function material, and the other electrode may be a lower work function material. For example, a noble or near noble metal (i.e., a metal with a low absolute value free energy change ($|\Delta G|$) of oxide formation) may be used for one electrode. Specific examples include iridium, iridium oxide, platinum, ruthenium, and ruthenium oxide. The other electrode may be a lower work function material, such as titanium nitride. In specific embodiments, the reset pulse at the electrode having the higher work function is a positive pulse.

In some embodiments, one or both electrodes of a ReRAM cell may be multi-layer electrodes formed by one or more different materials. For example, an electrode can include a base layer and capping layer. The base layer may include ruthenium, ruthenium oxide, iridium, iridium oxide, platinum, and various combinations thereof. The capping layer may include tungsten, tungsten carbonitride, and/or tungsten carbon. The multi-layer electrodes can be used to improve adhesion properties and performance of ReRAM cells.

In some embodiments, the first electrode layer includes titanium nitride and may be formed using PVD or other suitable deposition techniques. Deposition of the titanium nitride electrode may be performed using a titanium target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as ALD, PLD, CVD, evaporation, and the like can also be used to deposit the first electrode.

Method 300 may proceed with forming a layer of a carbon doped metal containing material during operation 306. This operation may involve flowing a metalorganic precursor into the processing chamber, such that a portion of the precursor is adsorbed on the substrate, and then flowing an oxidizing agent into the processing chamber such that a portion of the oxidizing agent reacts with the adsorbed precursor forming the layer. In some aspects, this operation is similar to ALD deposition techniques. However, in the presented process, the substrate is maintained at a temperature lower than a saturation temperature range used for ALD. It should be noted that each precursor used for ALD typically has a definite saturation temperature range. In other words, the substrate temperature during operation 306 is lower than one used for ALD. This lower temperature results in partial decomposition of the adsorbed metalorganic precursor and, as a result, in carbon doping of the deposited metal containing material.

Figure 3B:
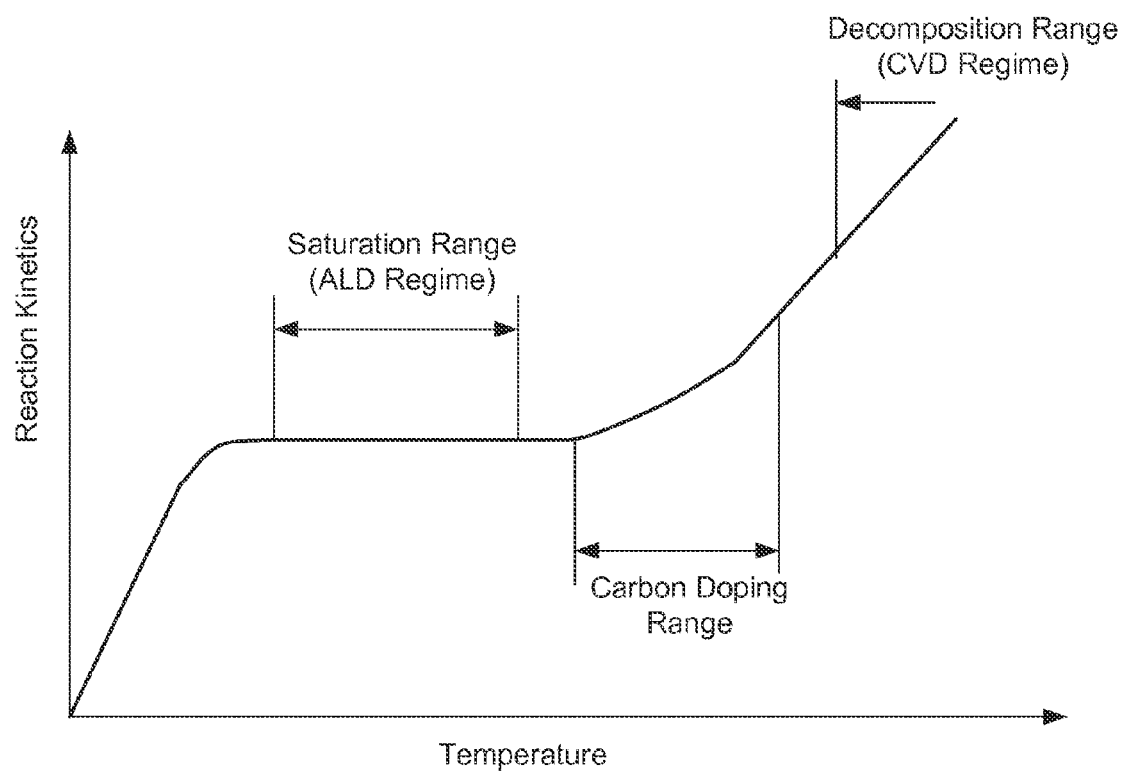
FIG. 3B is a plot of reaction kinetics as a function of the temperature for a typical metalorganic precursor.

Differences in temperatures used to form carbon doped metal containing layers relative to conventionally used ALD temperatures as well as conventionally used CVD temperatures will now be described with reference to FIG. 3B. Specifically, FIG. 3B illustrates a plot of reaction kinetics as a function of the substrate temperature for a typical organometallic precursor. Reaction kinetics generally increase with the temperature. However, each precursor has distinct temperature regions and types of reactions that occur in these temperature regions. The first region identified in FIG. 3B is a saturation temperature range used in conventional ALD. An ALD process involves adsorption of precursor molecules on a surface forming a monolayer followed by oxidation of the adsorbed precursor. Generally no chemical changes occur within the adsorbed precursor prior to its oxidation. The ALD oxidation involves forming volatile reaction products and removal of all carbon from the deposited layer. Without being restricted to any particular theory, it is believed that carbon may be converted into volatile carbon oxides by cleaving carbon-metal, carbon-carbon, and carbon-hydrogen bonds in the metalorganic precursor. Carbon-metal bonds are particularly weak making it easier to form carbon oxides.

CVD corresponds to another temperature range illustrated in FIG. 3B. CVD uses another mechanism that does not require any oxidizing agents. It is performed at substantially lower temperatures that ALD. A few examples of temperature ranges for different metalorganic precursors are provided below. During CVD, metalorganic precursors rapidly decompose upon reaching the heated surface. Oxidation agents may be supplied together with the metalorganic precursor or not supplied at all. Because of high temperature and high reaction kinetics no separate adsorption of the precursor occurs. Instead, the precursor reacts and reaction products are deposited onto the surface right away.

Temperature ranges proposed for forming the carbon doped metal containing layer during operation 306 fall in between conventionally used ALD temperatures and conventionally used CVD temperatures. Some examples of metalorganic precursors and proposed temperature ranges as well as corresponding ALD and CVD temperature ranges are presented in the table below.

TABLE

| Precursor | Conventional ALD Range | Proposed Range | Conventional CVD Range |
|---|---|---|---|
| Tetrakis dimethylamido hafnium (TDMAHf) | 240-300° C. | 150° C.-240° C. | >300° C. |
| Tetrakis(ethylmethylamide) (TEMAHf) | 240-300° C. | 150° C.-240° C. | >300° C. |
| Trimethal aluminum (TMA) | 200° C.-300° C. | 150° C.-200° C. | >300° C. |
| Tris(DiMethylAmino)Cyclo PentaDienylZirconium ($C_5H_5$)Zr[N($CH_3$)$_2$]$_3$$_{(Zy4LD)}$ | 200-270° C. | 150° C.-200° C. | >300° C. |
| tetrakis dimethylamido titanium (TDMATi) | 200-270° C. | 150° C.-200° C. | >300° C. |

Returning to FIG. 3A, operation 306 may involve multiple cycles, each involving the following steps: introduction of one or more metalorganic precursors into the processing chamber to form an absorbed layer, partial decomposition of the adsorbed precursor, and reaction of the remaining precursor with one or more oxidizing agents. There is no specific order required for the last two steps as some decomposition and reaction may proceed in parallel. In some embodiments, decomposition will start prior to introducing the one or more oxidizing agents into the processing chamber. However, not all adsorbed precursor may be decompose and some of it may oxidize. A layer formed during each deposition cycle described above may be between about 0.25 and 2 Angstroms thick, and the cycle is repeated to form a carbon doped metal containing layer of a desired thickness. In some embodiments, the thickness of a resulting resistive switching layer is less than 1000 Angstroms or, more specifically, less than 50 Angstroms. In some embodiments, the resistive switching layer is at least about 30 Angstroms thick.

A brief description of a deposition technique is presented below to provide better understanding of various processing features. Similar to ALD and CVD, metalorganic precursors are introduced into the processing chamber and allowed to flow over the substrate surface provided therein. Similar to ALD, the precursor is introduced in the form of pulses, i.e., pulsed into the processing chamber. Between the pulses, the reaction chamber is purged, for example, with an inert gas to remove unreacted precursors, reaction products, and other undesirable components from the chamber.

When a precursor is provided above the substrate surface, the precursor may at least partially adsorb (e.g., saturatively chemisorb) on that surface. Subsequent pulsing with a purging gas removes excess precursor from the processing chamber. After being adsorbed on the surface, the metalorganic precursor starts decomposing because of the elevated temperature of the substrate surface relative to the conventional ALD process. However, this temperature is not high enough to rapidly decompose the metalorganic precursor and release all carbon from the layer being formed on the substrate as typically happens during CVD. As such, some carbon remains in the layer. Modifications in the metalorganic precursor caused by this partial decomposition help to trap some of this carbon even during subsequent oxidation of the adsorbed and partially decomposed metalorganic precursor.

Another pulse introduces an oxidizing agent into the processing chamber and it reacts with the adsorbed and, in some embodiments, partially decomposed metalorganic precursor to form a carbon doped metal containing layer, e.g., a carbon doped metal oxide layer, carbon doped metal nitride layer, carbon doped metal oxinitride layer, and the like. Reaction byproducts and excess reactants are purged from the processing chamber. As with ALD, the amount of metalorganic precursor adsorbed on the surface makes this type of deposition self-limiting. This feature helps to improve deposition uniformity and conformality and allows more precise control of the resulting resistive switching characteristics.

The precursors used in this deposition process may be gaseous, liquid, or solid. However, liquid or solid precursors should be sufficiently volatile to allow introduction as a gas. The vapor pressure should be high enough for effective mass transportation. Also, solid and some liquid precursors may need to be heated and introduced through heated tubes to the substrates. The necessary vapor pressure should be reached at a temperature below the substrate temperature to avoid the condensation of the precursors on the substrate. Due to the self-limiting growth mechanisms, relatively low vapor pressure solid precursors can be used, though evaporation rates may somewhat vary during the process because of changes in their surface area.

Additional characteristics of precursors involve thermal stability and adsorption. Unlike precursors and process conditions used in ALD, the precursors used for the proposed deposition techniques should not be as thermally stable (at the selected processing temperatures) because their decomposition is, in fact, needed. While only a very slight decomposition can be tolerated in ALD, this process requires substantial decomposition of precursors to ensure adequate trapping of carbon in the resulting layers. As noted elsewhere in this document, the carbon content of a resistive switching layer may be up to 30 atomic percent in some embodiments or, more specifically, between about 10 atomic percent and 20 atomic percent.

Similar to ALD, the precursors should still adsorb (e.g., chemisorb) on or react with the surface, though the interaction between the precursor and the surface as well as the mechanism for the adsorption may be different for different precursors. In some embodiments, partial decomposition of the metalorganic precursors may help to retain precursors on the surface. The molecules at the substrate surface should react aggressively with the reactant to form the desired film. Additionally, precursors should not react with the film to cause etching, and precursors should not dissolve in the film.

In some embodiments, metalorganic precursors are used to form layers including nickel oxide, niobium oxide, titanium oxide, hafnium oxide, aluminum oxide, aluminum nitride, tantalum oxide, zirconium oxide, yttrium oxide, scandium oxide, magnesium oxide, chromium oxide, and vanadium oxide. Some suitable metalorganic precursors containing titanium include bis(tert-butylcyclopentadienyl) titanium dichloride ($C_{18}H_{26}Cl_2Ti$), bis(diethylamido)bis(dimethylamido)titanium ($Ti(N(CH_3)_2)_2(N(CH_2CH_3)_2)_2$), tetrakis(diethylamido)titanium ($[(C_2H_5)_2N]_4Ti$), tetrakis(dimethylamido)titanium ($[(CH_3)_2N]_4Ti$), tetrakis(ethylmethylamido) titanium ($[(CH_3C_2H_5)N]_4Ti$), titanium diisopropoxidebis(2,2,6,6-tetramethyl-3,5-heptanedionate) ($Ti[OCC(CH_3)_3CHCOC(CH_3)_3]_2(OC_3H_7)_2$), and titanium isopropoxide ($Ti[OCH(CH_3)_2]_4$). Some example of tantalum containing precursors include pentakis (dimethylamino) tantalum ($Ta(N(CH_3)_2)_5$), tris(diethylamido) (tert-butylimido) tantalum ($(CH_3)_3CNTa(N(C_2H_5)_2)_3$), tris(diethylamido) (ethylimido) tantalum ($C_2H_5NTa(N(C_2H_5)_2)_3$), tris(ethylmethylamido) (tert-butylimido) tantalum ($C_{13}H_{33}N_4Ta$). Examples of tungsten containing precursors include bis(butylcyclopentadienyl) tungsten diiodide ($C_{18}H_{26}I_2W$), bis(tert-butylimino)bis(tert-butylamino) tungsten ($(C_4H_9NH)_2W(C_4H_9N)_2$), bis(tert-butylimino)bis(dimethylamino) tungsten ($((CH_3)_3CN)_2W(N(CH_3)_2)_2$), bis(cyclopentadienyl) tungstendichloride ($C_{10}H_{10}Cl_2W$), bis(cyclopentadienyl) tungsten dihydride ($C_{10}H_{12}W$), bis(isopropylcyclopentadienyl) tungsten dihydride ($(C_5H_4CH(CH_3)_2)_2WH_2$), cyclopentadienyl tungsten tricarbonyl hydride ($C_8H_6O_3W$), and tetracarbonyl(1,5-cyclooctadiene)tungsten ($C_{12}H_{12}O_4W$). An example of a niobium containing precursor includes bis(cyclopentadienyl) niobium dichloride ($C_{10}H_{10}Cl_2Nb$). Examples of nickel containing precursors include bis(cyclopentadienyl) nickel ($Ni(C_5H_5)_2$), bis(ethylcyclopentadienyl) nickel ($Ni(C_5H_4C_2H_5)_2$), bis(triphenylphosphine) nickel dichloride ($[(C_6H_5)_3P]_2NiCl_2$), nickel bis(2,2,6,6-tetramethyl-3,5-heptanedionate) ($Ni(OCC(CH_3)_3CHCOC(CH_3)_3)_2$). Examples of aluminum containing precursors include aluminum tris(2,2,6,6-tetramethyl-3,5-heptanedionate) ($Al(OCC(CH_3)_3CHCOC(CH_3)_3)_3$), triisobutylaluminum ($[(CH_3)_2CHCH_2]_3Al$), trimethylaluminum ($(CH_3)_3Al$), tris(dimethylamido) aluminum ($Al(N(CH_3)_2)_3$). Some examples of hafnium containing precursors include bis(tert-butylcyclopentadienyl)dimethyl hafnium ($C_{20}H_{32}Hf$), bis(methyl-η5-cyclopentadienyl) methoxymethyl hafnium ($HfCH_3(OCH_3)[C_5H_4(CH_3)]_2$), bis(trimethylsilyl) amido hafnium chloride ($[[(CH_3)_3Si]_2N]_2HfCl_2$), dimethylbis(cyclopentadienyl) hafnium ($(C_5H_5)_2Hf(CH_3)_2$), hafnium isopropoxide isopropanol adduct ($C_{12}H_{28}HfO_4$), tetrakis(diethylamido) hafnium ($[(CH_2CH_3)_2N]_4Hf$), and tetrakis(ethylmethylamido) hafnium ($[(CH_3)(C_2H_5)N]_4Hf$). Some hafnium containing precursors can be represented with a formula $(RR'N)_4Hf$, where R and R' are independent hydrogen or alkyl groups and may be the same or different.

After the metalorganic precursor is adsorbed and, in some embodiments, partially decomposed on the substrate surface, a pulse of an oxidizing agent is provided to the processing chamber. Some examples of suitable oxidizing agents include water ($H_2O$), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), ammonia ($NH_3$), alcohols (e.g., ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds, e.g., produced by heat, hot-wires, and/or plasma.

The oxidizing agent reacts with the metalorganic precursor on the substrate and forms a carbon doped metal containing layer. Unreacted oxidizing agent and volatile reaction products are then purged from the processing chamber. This cycle may be repeated until the desired thickness of carbon doped metal containing layer.

In some embodiments, the carbon doped metal containing layer may be treated during operation 308. Because the layer is generally relative thin, operation 308 may be performed only once on the fully formed carbon doped metal containing layer. Alternatively, operation 308 may be repeated multiple times while forming the carbon doped metal containing layer. For example, one or more deposition cycles described above may be followed by a treatment operation, and this entire sequence is then repeated one or more times.

Treatment operation 308 may involve plasma treatment, thermal treatment, or other types of treatment. Other treatment options include soaking in silane ($SiH_4$) environment while generating plasma to incorporate silicon into the film. Plasma treatment may be also performed in carbon tetra fluoride environment ($CF_4$) to incorporate fluorine. In some embodiments, treatment involves plasma nitridation that may be used to incorporate nitrogen into the carbon doped metal containing layer. Plasma carbonization may be also used to incorporate additional carbon into the layer.

Ionization of gases used for plasma treatment supply activation energy to incorporate new materials and/or to make changes in the existing materials. This ionization energy may be supplied instead or in addition to thermal energy, which may be supplied by heating the substrate. Plasma treatment involves intense electric fields used to generate ionized molecules of the gas (referred to as plasma) around the surface to be processed. Plasma may be generated using nitrogen containing gases, carbon containing gases, inert gases, silane, carbon tetra-fluoride, and other types of gases. Nitridation may be performed in nitrogen ($N_2$) environment while the substrate is kept at between about 200° C. and 300° C. (e.g., about 250° C.) at power levels of about 1000 W and 2000 W (e.g., about 1500W, the power depending on the substrate size and other conditions). The pressure inside the chamber may be between about 0.1 Torr and 0.2 Torr and duration of the process may be between about 10 minutes and 30 minutes. In some embodiments, plasma treatment (e.g., plasma nitridation) is performed for at least 60 seconds, e.g., about 90 seconds, but less than 180 seconds, for example.

As mentioned above, treatment of the carbon doped metal containing layer during operation 308 may change the material properties of this layer. These changes may or may not correspond to compositional changes of this layer. In some embodiments, the treatment changes chemical bonds of carbon in the carbon doped metal containing material. For example, the treated carbon doped metal oxide may have fewer carbon-hydrogen bonds than the untreated material. In some embodiments, the treated material has more carbon-carbon bonds than the untreated one. The same may apply to carbon-oxygen bonds. Despite these changes in carbon bonds, the concentration and/or the amount of carbon provided in the layer may remain unchanged before and after treatment. Changes in chemical bonds are further described in the experimental results section below.

Method 300 may continue with depositing a second electrode layer during operation 310. The second electrode layer may be deposited in a manner similar to the first electrode layer described above with reference to operation 304.

Examples of ReRAM Cells

Figure 4:
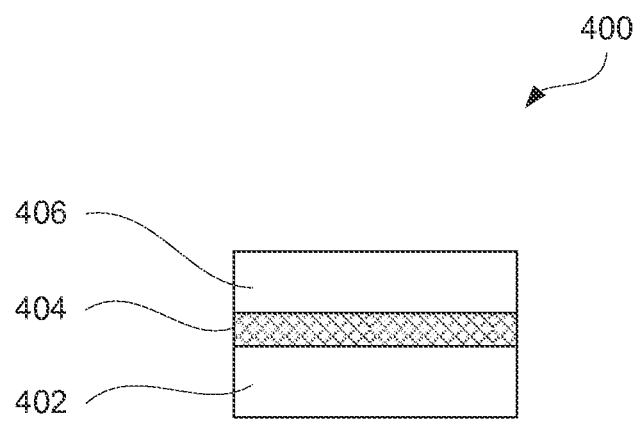
FIG. 4 illustrates a schematic representation of a ReRAM cell, in accordance with some embodiments.

FIG. 4 illustrates a schematic representation of ReRAM cell 400, in accordance with some embodiments. ReRAM cell 400 may include first electrode electrode layer 402, resistive switching layer 404, and second electrode layer 406. The "first" and "second" terminology is used herein only for differentiating reasons and does not imply any deposition order or spatial orientation of the layers unless specifically noted. Various examples of resistive switching layer 404 are described above with reference to FIG. 3.

First electrode layer 402 and second electrode layer 406 provide electrical connections to ReRAM cell 400. In some embodiments, first electrode layer 402 and/or second electrode layer 406 are parts of signal lines that extend between multiple ReRAM cells, which may be cells provided in the same row or column a memory array as further described below with reference to FIGS. 6A and 6B. In some embodiments, first electrode layer 402 and/or second electrode layer 406 may be separate components from the signal lines. For example, first electrode layer 402 or second electrode layer 406 may be an intermediate electrode and additional components, such as a diode may be provided between this electrode and a signal line.

First electrode layer 402 and second electrode layer 406 are typically made from conductive materials. Some examples of suitable electrode materials include n-doped polysilicon, titanium nitride, ruthenium, iridium, platinum, and tantalum nitride. First electrode layer 402 and/or second electrode layer 406 may have a thickness of less than about 1,000 Angstroms, such as less than about 500 Angstroms and even less than about 100 Angstroms. Thinner electrodes may be formed using ALD techniques.

In some embodiments, first electrode layer 402 or second electrode layer 406 does not directly interface resistive switching layer 404. A diffusion layer (not shown) may be disposed between this electrode layer and resistive switching layer 404. A diffusion barrier may be made from suitable oxygen blocking materials, such as TiSiN, TaSiN, and WSiN. In some embodiments, the diffusion barrier layer is less than about 100 Angstroms thick, for example, between 25 Angstroms and 75 Angstroms thick, such as about 50 Angstroms thick.

In some embodiments, ReRAM cell 400 includes a current limiting layer. This layer may be formed from a material having a suitable work function for controlling the electron flow through ReRAM cell 400. In some embodiments, the current limiting layer is used to increase or decrease the formed barrier height at its interface with the resistive switching layer. This feature is used to improve current flowing characteristics and reduce the magnitude of the switching currents. It should be noted that these changes in the barrier height will generally not affect the ratio of switching currents ($I_{ON}/I_{OFF}$), and thus not impact detectability of different resistive states.

To achieve desirable electrical and/or physical properties of the current limiting layer, its composition, structure, and/or deposition conditions may be specifically controlled. In some embodiments, the current limiting layer is between about 50 Angstroms and 1000 Angstroms thick, such as between about 200 Angstroms and 50 Angstroms. The current limiting layer may be formed from a material that has a resistivity of between about 5 Ohm-cm and 500 Ohm-cm, such as between about 50 Ohm-cm and 150 Ohm-cm. In some embodiments, the current limiting layer is formed such that its resistance ($R_{RL}$) is between about 10 kilo-Ohm and about 10 mega-Ohm, such as between about 100 kilo-Ohm and about 1 mega-Ohm.

Resistivity is an intrinsic property of the material and can be controlled by adjusting the composition of the material. Some specific examples, include adding alloying elements or doping atoms and/or adjusting the morphological structure of the materials, (e.g., shifting from amorphous to crystal structure). In some embodiments, a current limiting layer may include titanium oxide doped with niobium, tin oxide doped with antimony, or zinc oxide doped with aluminum. The concentration of a dopant material in the base material may be between about 0.5 and 25 atomic percent or, more specifically, between about 1 and 10 atomic percent Other examples of materials suitable for the current limiting layer include titanium nitride ($Ti_xN_y$), tantalum nitride ($Ta_xN_y$), silicon nitride (SiN), hafnium nitride ($Hf_xN_y$) or titanium aluminum nitride ($Ti_xAl_yN_z$) layer. Such layer may be formed using an ALD, CVD or PVD techniques.

Apparatus Examples

Figure 5:
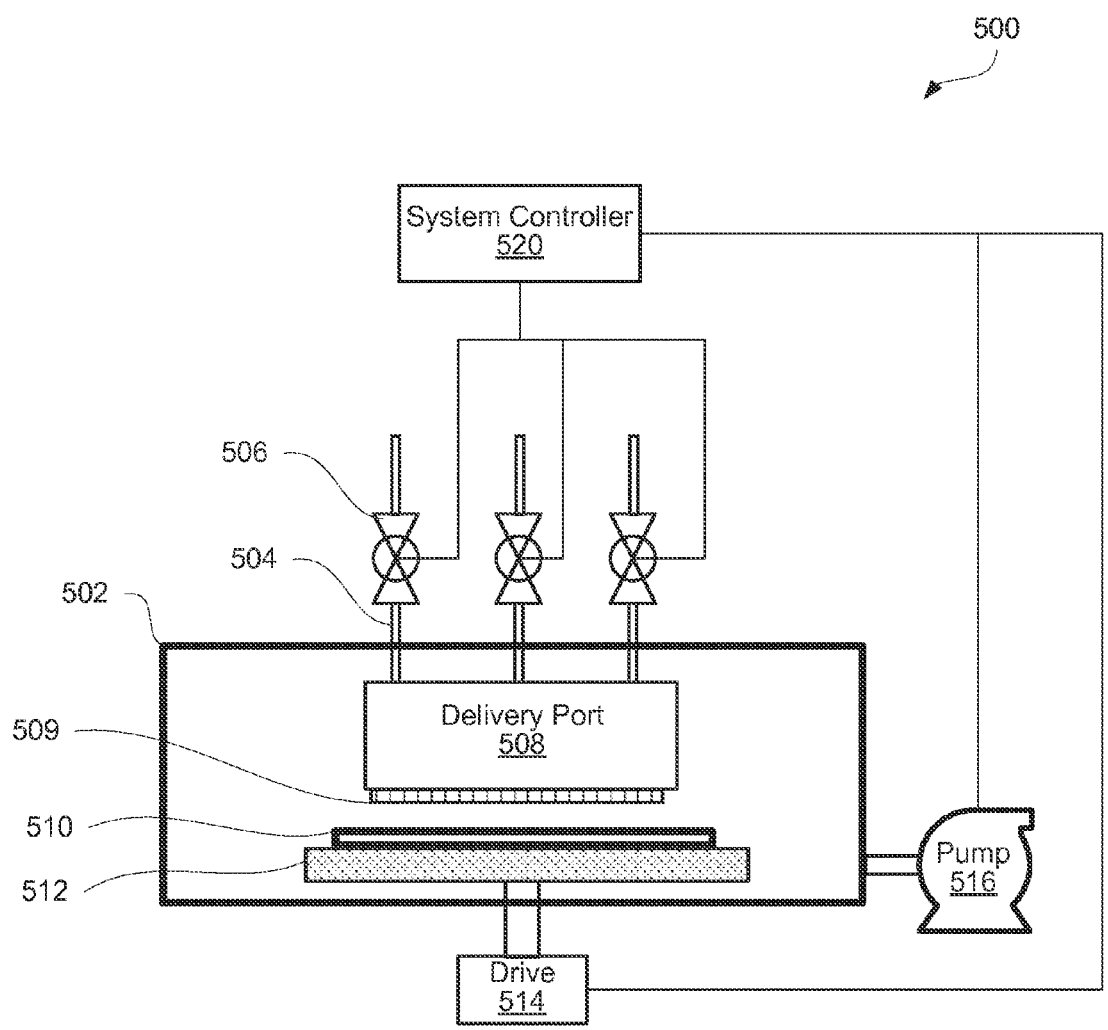
FIG. 5 illustrates a schematic representation of a deposition apparatus for fabricating ReRAM cells, in accordance with some embodiments.

FIG. 5 illustrates a schematic representation of deposition apparatus 500 for fabricating ReRAM cells, in accordance with some embodiments. For clarity, some components of apparatus 500 are not included in this figure, such as a wafer-loading port, wafer lift pins, and electrical feed throughs. Apparatus 500 includes processing chamber 502 connected to processing gas delivery lines 504. While FIG. 5 illustrates three delivery lines 504, any number of delivery lines may be used. Each line may be equipped with a valve and/or mass flow controller 506 for controlling the delivery rates of processing gases into processing chamber 502. In some embodiments, gases are provided into delivery port 508 prior to exposing substrate 510 to processing gases. Delivery port 508 may be used for premixing gases (e.g., precursors and diluents) and even distribution of gases over the surface of substrate 510. Delivery port 508 is sometimes referred to as a showerhead. Delivery port 508 may include a diffusion plate 509 having with multiple holes for gas distribution.

Processing chamber 502 encloses substrate support 512 for holding substrate 510 during its processing. Substrate support 512 may be made from a thermally conducting metal (e.g., W, Mo, Al, Ni) or other like materials (e.g., conductive ceramic) and may be used to maintain the substrate temperature at desired levels. Substrate support 512 may be connected to drive 514 for moving substrate 510 during loading, unloading, process set up, and sometimes even during processing. Processing chamber 502 may be connected to vacuum pump 516 for evacuating reaction products and unreacted gases from processing chamber 502 and for maintaining the desirable pressure inside chamber 502.

Apparatus 500 may include system controller 520 for controlling process conditions during electrode and resistive switching layer deposition and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments.

Memory Array Examples

Figure 6A:
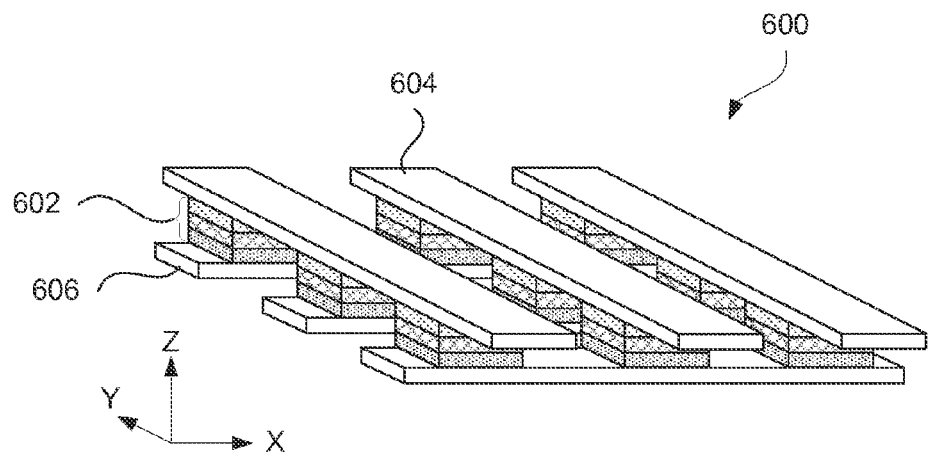
FIGS. 6A and 6B illustrate schematic views of memory arrays including multiple ReRAM cells, in accordance with some embodiments.

A brief description of memory arrays will now be described with reference to FIGS. 6A and 6B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistance switching layer, embedded resistors, embedded current steering elements, and the like, some of which are further described elsewhere in this document. In some embodiments, a ReRAM cell includes multiple resistance switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
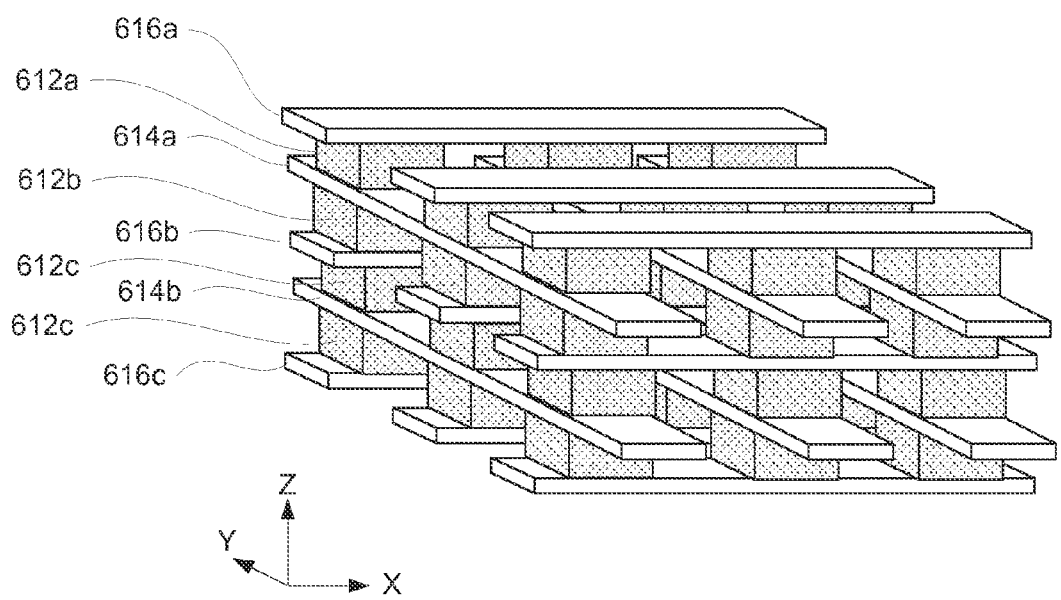

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.
Experimental Data The performance of carbon doped metal containing materials for resistive switching layers in ReRAM cells were evaluated. Two sets of carbon doped aluminum oxide layers were initially deposited using tri-methyl aluminum (TMA) as a metalorganic precursor and ozone as an oxidant. The deposition temperature was maintained at 250° C. for both sets. It should be noted that a typical ALD temperature for TMA is between about 200° C. and 300° C., while a typical CVD temperature is at least about 400° C. The target thickness of each layer was 30-50 Angstroms. The layers were deposited on substrates containing n-doped polysilicon electrodes.

Each set of these carbon doped aluminum oxide layers was then subjected to plasma-based nitridation using different process conditions. The first set was nitridized for 45 seconds, while the second set was nitridized for 90 seconds. Samples from each of the two sets were then analyzed using X-ray photoelectron spectroscopy (XPS) after the plasma nitridation. The results of the XPS analysis (expressed in percent) are presented in the table below.

TABLE

Results of XPS Analysis after Plasma Nitridation

|  | First Set— 45 s Nitridation | Second Set— 90 s Nitridation |
| --- | --- | --- |
| C1s | 8.2 | 17.2 |
| O1s | 45.4 | 39.4 |
| N1s | 6.9 | 8.1 |
| Si2p | 6.0 | 6.2 |
| Al2p | 33.5 | 29.1 |

Without being restricted to any particular theory, it is believed that plasma nitridation changes chemical bonds of carbon in the treated carbon doped aluminum oxide layers. The chemical bonds are converted from carbon-hydrogen bonds, which are generally undetectable in the XPS analysis to carbon-carbon and carbon-oxygen bonds. It is also believed that relatively weak carbon-aluminum bonds have been substantially broken during oxidation and/or decomposition of TMA.

The plasma treated samples from both sets were further processed to add titanium nitride electrodes over the carbon doped aluminum oxide layers. ReRAM cells that were 150 nanometers by 150 nanometers in size were formed, each including n-doped polysilicon electrode, plasma treated carbon doped aluminum oxides layer, and titanium nitride electrode. Switching characteristics of these cells were tested by applying 50 nanoseconds long switching voltage pulses followed by reading pulses. The switching voltages were gradually ramped up until resistive switching points were detected.

TABLE

Results of Resistive Switching Analysis

|  | First Set— 45 s Nitridation | Second Set— 90 s Nitridation |
| --- | --- | --- |
| C1s | 8.2 | 17.2 |
| Iset(uA) | 72 | 34 |
| Ireset(uA) | 268 | 188 |
| Vset(V) | −3.2 | −3 |
| Vreset(V) | 4 | 3.6 |

These results clearly indicate that a higher concentration of certain carbon bonds in resistive switching layers substantially lowers set and reset currents and voltages of these layers. Specifically, carbon in the second set of samples exhibited more doping-like behavior than in the first set of samples, even though the actual amounts of carbon in both sets are believed to be substantially the same. Without being restricted to any particular theory, it is believed that incorporating carbon as a dopant into metal oxide structure (e.g., lattice) introduces stresses into this structure and make it more susceptive to resistive switching, i.e., requiring lower voltages and currents to change resistive characteristics of this structure.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of forming a resistive random access memory cell, the method comprising:
   providing a substrate comprising a first electrode layer into a processing chamber;
   flowing a metalorganic precursor into the processing chamber such that a portion of the metalorganic precursor is adsorbed on the substrate; and
   flowing an oxidizing agent into the processing chamber such that a portion of the oxidizing agent reacts with the adsorbed metalorganic precursor forming a layer of a metal containing material,
       wherein the substrate is maintained at a temperature lower than a saturation range temperature associated with the metalorganic precursor resulting in partial decomposition of the adsorbed metalorganic precursor and in carbon doping of the metal containing material, and
       wherein the layer of the carbon doped metal containing material is operable as a resistive switching layer in the resistive random access memory cell;
   performing a treatment of the carbon doped metal containing material, the treatment comprising one of plasma treatment or thermal treatment.

2. The method of claim 1, wherein the treated material has fewer carbon-hydrogen bonds than the untreated material.

3. The method of claim 1, wherein the treated material has more carbon-carbon and carbon-oxygen bonds than the untreated material.

4. The method of claim 1, wherein a concentration of carbon in the treated material and the untreated material is substantially the same.

5. The method of claim 1, wherein the treatment comprises plasma nitridation and incorporates nitrogen into the carbon doped metal containing material.

6. The method of claim 5, wherein the plasma nitridation is performed for at least 60 seconds and less than 180 seconds.

7. The method of claim 1, wherein the treatment comprises one of plasma carbonization or thermal carbonization.

8. The method of claim 1, wherein the metalorganic precursor comprises tetrakis dimethylamido hafnium (TDMAHf), and wherein the substrate is maintained at a temperature of between 300° C. and 340° C. while forming the carbon doped metal containing layer.

9. The method of claim 1, wherein the metalorganic precursor comprises trimethal aluminum (TMA), and wherein the substrate is maintained at a temperature of 230° C. and 270° C. while forming the carbon doped metal containing layer.

10. The method of claim 1, wherein the carbon doped metal containing material comprises one of hafnium oxide, aluminum oxide, nickel oxide, or zirconium oxide.

11. The method of claim 1, wherein a set current of the resistive random access memory cell is less than about 50 microamperes.

12. The method of claim 1, wherein a reset current of the resistive random access memory cell is less than about 200 microamperes.

13. The method of claim 1, wherein a thickness of the layer of the carbon doped metal containing material is less than about 100 Angstroms.

14. The method of claim 1, wherein a thickness of the layer of the carbon doped metal containing material is less than about 50 Angstroms.

15. The method of claim 1, wherein the first electrode layer comprises doped polysilicon.

16. The method of claim 15, wherein the layer of the carbon doped metal containing material directly interfaces the first electrode layer.

17. The method of claim 1, further comprising forming a second electrode layer over the layer of the carbon doped metal containing material, the second electrode layer comprising titanium nitride.

18. A method of forming a resistive random access memory cell, the method comprising:

provided a substrate comprising polysilicon into a processing chamber;

flowing trimethal aluminum (TMA) into the processing chamber such that a portion of TMA is adsorbed on the substrate; and flowing an oxidizing agent such that a portion of the oxidizing agent reacts with the adsorbed TMA forming a layer of aluminum oxide, wherein the substrate is maintained at a temperature at a temperature of 230° C. and 270° C. resulting in partial decomposition of TMA and incorporating carbon into the layer of aluminum oxide producing a carbon doped aluminum oxide layer; and performing a plasma nitridation treatment of the carbon doped aluminum oxide layer, wherein the treated carbon doped aluminum oxide layer is operable as a resistive switching layer such that the resistive random access memory cell has a set current of less than 50 microamperes and a reset current of the resistive switching layer is less than 200 microamperes.

* * * * *